(12) United States Patent
Wang et al.

(10) Patent No.: US 9,093,390 B2
(45) Date of Patent: *Jul. 28, 2015

(54) CONFORMAL OXIDE DRY ETCH

(71) Applicant: Applied Materials, Inc., Santa Clara, CA (US)

(72) Inventors: Anchuan Wang, San Jose, CA (US); Jingchun Zhang, Cupertino, CA (US); Nitin K. Ingle, San Jose, CA (US); Young S. Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/314,889

(22) Filed: Jun. 25, 2014

(65) Prior Publication Data

US 2014/0308818 A1    Oct. 16, 2014

Related U.S. Application Data

(63) Continuation of application No. 13/908,184, filed on Jun. 3, 2013, now Pat. No. 8,801,952.

(60) Provisional application No. 61/773,967, filed on Mar. 7, 2013.

(51) Int. Cl.
*H01L 21/302* (2006.01)
*H01L 21/461* (2006.01)
(Continued)

(52) U.S. Cl.
CPC ............ *H01L 21/31116* (2013.01); *B44C 1/22* (2013.01); *C03C 15/00* (2013.01); *C03C 25/68* (2013.01); *H01J 37/32449* (2013.01); *H01J 37/32724* (2013.01)

(58) Field of Classification Search
CPC ............. H01L 21/31116; B01D 69/10; B01D 69/144; B44C 1/22
USPC ............................................ 216/79; 438/723
See application file for complete search history.

(56) References Cited

U.S. PATENT DOCUMENTS

| 2,369,620 A | 2/1945 | Sullivan et al. |
|---|---|---|
| 3,451,840 A | 6/1969 | Hough |

(Continued)

FOREIGN PATENT DOCUMENTS

| CN | 1375575 | 10/2002 |
|---|---|---|
| CN | 1412861 A | 4/2003 |

(Continued)

OTHER PUBLICATIONS

Abe et al., "Developments of plasma etching technology for fabricating semiconductor devices," Jpn. J. Appl. Phys., vol. 47, No. 3R, Mar. 2008, 21 pgs.

(Continued)

*Primary Examiner* — Roberts Culbert
(74) *Attorney, Agent, or Firm* — Kilpatrick Townsend & Stockton LLP (57) ABSTRACT

A method of etching silicon oxide from a trench is described which allows more homogeneous etch rates up and down the sides of the trench. One disclosed method includes a sequential introduction of (1) a hydrogen-containing precursor and then (2) a fluorine-containing precursor into a substrate processing region. The temperature of the substrate is low during each of the two steps in order to allow the reaction to proceed and form solid residue by-product. A second disclosed method reverses the order of steps (1) and (2) but still forms solid residue by-product. The solid residue by-product is removed by raising the temperature in a subsequent sublimation step regardless of the order of the two steps.

17 Claims, 4 Drawing Sheets

(51) Int. Cl.
*H01L 21/311* (2006.01)
*B44C 1/22* (2006.01)
*C03C 15/00* (2006.01)
*C03C 25/68* (2006.01)
*H01J 37/32* (2006.01)

(56) References Cited

U.S. PATENT DOCUMENTS

| | | |
|---|---|---|
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchaikit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,218 A | 7/1994 | Brusasco et al. |
| 5,328,558 A | 7/1994 | Kawamura |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |

(56) References Cited

U.S. PATENT DOCUMENTS

| | | |
|---|---|---|
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsiung et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |

(56) References Cited

U.S. PATENT DOCUMENTS

| | | |
|---|---|---|
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Namani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,416,989 B1 * | 8/2008 | Liu et al. ............... 438/706 |
| 7,465,358 B2 | 12/2008 | Weidman et al. |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0055842 A1 | 12/2001 | Uh et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0124867 A1 | 9/2002 | Kim et al. |
| 2002/0177322 A1 | 11/2002 | Li et al. |
| 2002/0187655 A1 | 12/2002 | Tan et al. |
| 2002/0197823 A1 | 12/2002 | Yoo et al. |

(56) References Cited

U.S. PATENT DOCUMENTS

| | | |
|---|---|---|
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246717 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Hua et al. |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0189246 A1 | 7/2009 | Wu et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0280650 A1 | 11/2009 | Lubomirsky et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0144140 A1 | 6/2010 | Chandrashekar et al. |

(56) References Cited

U.S. PATENT DOCUMENTS

| | | |
|---|---|---|
| 2010/0173499 A1 | 7/2010 | Tao et al. |
| 2010/0187534 A1 | 7/2010 | Nishi et al. |
| 2010/0187588 A1 | 7/2010 | Gil-Sub et al. |
| 2010/0330814 A1 | 12/2010 | Yokota et al. |
| 2011/0008950 A1 | 1/2011 | Xu |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0159690 A1 | 6/2011 | Chandrashekar et al. |
| 2011/0165771 A1 | 7/2011 | Ring et al. |
| 2011/0195575 A1 | 8/2011 | Wang |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0260533 A1 | 10/2013 | Sapre et al. |
| 2013/0284369 A1 | 10/2013 | Kobayashi et al. |
| 2013/0284370 A1 | 10/2013 | Kobayashi et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 7/2007 |
| JP | 2007-173383 A | 7/2007 |
| JP | 08-148470 A | 6/2008 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 1020080063988 A | 7/2008 |
| KR | 10-2010-0013980 A | 2/2010 |
| KR | 10-2010-0074508 A | 7/2010 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 2011/087580 A1 | 7/2001 |
| WO | 01/94719 A1 | 12/2001 |
| WO | 02/083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Cho et al., "Dielectric-barrier microdischarge structure for effic ient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6 Jun. 2014, 4 pages.

Cho et al., "Three-dimensional spatiotemporal behaviors of light emission from discharge plasma of alternating current plasma display panels," Appl. Phys. Lett., vol. 92, No. 22, Jun. 2008, 3pgs.

Cho et al., "Analysis of address discharge modes by using a three-dimensional plasma display panel," IEEE Trans. Plasma Sci., vol. 36, Oct. 2008, 4 pgs.

C.K. Hu, et al. "Reduced Electromigration of Cu Wires by Surface Coating" Applied Physics Letters, vol. 81, No. 10, Sep. 2, 2002—pp. 1782-1784.

European Search Report dated May 23, 2006 for EP Application No. 05251143.3.

European Examination Report dated Nov. 13, 2007 for EP Application No. 05251143.3 (APPM/008802EP).

(56) References Cited

OTHER PUBLICATIONS

EP Partial Search Report, Application No. 08150111.601235/1944796, dated Aug. 22, 2008.
Eze, F. C., "Electroless deposition of CoO thin films," J. Phys. D: Appl. Phys. 32 (1999), pp. 533-540.
Galiano et al. "Stress-Temperature Behavior of Oxide Films Used for Intermetal Dielectric Applications", VMIC Conference, Jun. 9-10, 1992, pp. 100-106.
Goebels, F.J. et al. "Arbitrary Polarization from Annular Slot Planar Antennas." Ire Transactions on Antennas and Propagation, Jul. 1961, 8 pgs.
Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.
International Search Report of PCT/US2009/059743 mailed on Apr. 26, 2010, 4 pages.
International Search Report of PCT/US2012/061726 mailed on May 16, 2013, 3 pages.
International Search Report of PCT/2013/052039 mailed on Nov. 8, 2013, 9 pages.
International Search Report of PCT/2013/037202 mailed on Aug. 23, 2013, 11 pages.
Kim et al., "Pendulum electrons in micro hollow cathode di scharges," IEEE Trans. Plasma Sci. , vol. 36, No. 4, pp. Aug. 2008, 2 pgs.
Lin, et al., "Manufacturing of Cu Electroless Nickel/Sn-Pb Flip Chip Solder Bumps", IEEE Transactions on Advanced Packaging, vol. 22, No. 4 (Nov. 1999), pp. 575-579.
Lopatin, et al., "Thin Electroless barrier for copper films", Part of the SPIE Conference of Multilevel Interconnect technology II, SPIE vol. 3508 (1998), pp. 65-77.
Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.
Pearlstein, Fred. "Electroless Plating," J. Res. Natl. Bur. Stan., Ch. 31 (1974), pp. 710-747.
Redolfi et al., "Bulk FinFET fabrication with new approaches for oxide topography control using dry removal techniques," Solid-State Electron., vol. 71, May 2012, 7 pgs.
Saito, et al., "Electroless deposition of Ni-B, Co-B and Ni-Co-B alloys using dimethylamineborane as a reducing agent," Journal of Applied Electrochemistry 28 (1998), pp. 559-563.
Schacham-Diamond, et al., "Electrochemically deposited thin film alloys for ULSI and MEMS applications," Microelectronic Engineering 50 (2000), pp. 525-531.
Schacham-Diamond, et al. "Material properties of electroless 100-200 nm thick CoWP films,"Electrochemical Society Proceedings, vol. 99-34, pp. 102-110.
Schoenbach et al.,"High-pressure hollow cathode di scharges," Plasma Sources Sci. Te chnol.,vol. 6, No. 4, Nov. 1997, 10 pgs.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003,30 pages see pp. 717-718, John Wiley & Sons, Inc.
Yasaka, Y. et al. "Planar microwave discharges with active control of plasma uniformity". Physics of Plasmas, vol. 9 No. 3, Mar. 2002, 7 pgs.
Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.

Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3. I (APPM/008802 EPC E).
Fukada et al., "Preparation of SiOF Films with Low Dielectric Constant by ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/Semi Advanced Semiconductor Manufacturing Conference, 2007, 3 pages.
International Search Report and Written Opinion of the International Searching Authority mailed Jul. 3, 2008 (PCT/US05/46226; APPM8802PC02).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.
Jung, et al., "Patterning with amorphous carbon spacer for expanding the resolution limit of current lithography tool", Proc. SPIE , 2007, 9 pages, vol. 6520, 65201C.
Laxman, "Low ϵ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.

(56) References Cited

OTHER PUBLICATIONS

Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).

Mukai, et al., "A Study of CD Budget in Spacer Patterning Process", Toshiba, SPIE 2008, Feb. 26, 2008, 12 pages.

Nishino, et al.; Damage-Free Selective Etching of Si Native Oxides Using NH3/NF3 and SF6/H20 Down-Flow Etching, The Japanese Society of Applied Physics, vol. 74, No. 2, pp. 1345-1348, XP-002491959, Jul. 15, 1993.

Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.

Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.

Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.

Robles, et al. "Effects of Rf Frequency and Deposition Rates on the Moisture Resistance of PECVD TEOS-Based Oxide Films", ECS Extended Abstracts, Abstract No. 129, May 1992, pp. 215-216, vol. 92-1.

Shapiro, et al. "Dual Frequency Plasma CVD Fluorosilicate Glass: Water Absorption and Stability", ISMIC, DUMIC Conference Feb. 21-22, 1995, 1995. pp. 118-123.

S.M. Sze, VLSI Technology, McGraw-Hill Book Company, pp. 107, 108.

C.C. Tang and D. W. Hess, Tungsten Etching in CF4 and SF6 Discharges, J. Electrochem. Soc., 1984, 131 (1984) p. 115-120.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Wang et al.; Ultra High-selectivity silicon nitride etch process using an inductively coupled plasma source; J. Vac. Sci. Techno!. A 16(3), May/Jun. 1998, pp. 1582-1587.

Wolf et al.; Silicon Processing for the VLSI Era; vol. 1; 1986; Lattice Press, pp. 546, 547, 618, 619.

Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.

Yasuda et al., "Dual-function remote plasma etching/cleaning system applied to selective etching of Si02 and removal of polymeric residues," J. Vac. Sci. Technol., A, vol. 11, No. 5, 1993, 12 pgs.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

\* cited by examiner

CONFORMAL OXIDE DRY ETCH

CROSS-REFERENCES TO RELATED APPLICATIONS

This application is a continuation of and claims benefit to U.S. patent application Ser. No. 13/908,184 filed Jun. 3, 2013, which claims the benefit of U.S. Prov. Pat. App. No. 61/773,967 filed Mar. 7, 2013, and titled "CONFORMAL OXIDE DRY ETCH," both of which are hereby incorporated by reference herein for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

A Siconi™ etch is a remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The Siconi™ etch is largely conformal and selective towards silicon oxide layers but does not readily etch silicon regardless of whether the silicon is amorphous, crystalline or polycrystalline. The selectivity provides advantages for applications such as shallow trench isolation (STI) and inter-layer dielectric (ILD) recess formation.

Such etch processing steps have been used to trim silicon oxide uniformly back from a narrow trench to former a wider trench before depositing metal to form a contact on a patterned substrate. Etch processes used until now may result in trench width variations in the event the walls of the trench are formed by silicon oxide deposited using distinct methods.

Methods are needed to provide greater uniformity of dry etch processes.

BRIEF SUMMARY OF THE INVENTION

A method of etching silicon oxide from a trench is described which allows more homogeneous etch rates up and down the sides of the trench. One disclosed method includes a sequential introduction of (1) a hydrogen-containing precursor and then (2) a fluorine-containing precursor into a substrate processing region. The temperature of the substrate is low during each of the two steps in order to allow the reaction to proceed and form solid residue by-product. A second disclosed method reverses the order of steps (1) and (2) but still forms solid residue by-product. The solid residue by-product is removed by raising the temperature in a subsequent sublimation step regardless of the order of the two steps.

Embodiments of the invention include methods of etching silicon oxide from the walls of a trench on a surface of a patterned substrate in a substrate processing region of a substrate processing chamber. The methods include at least four sequential steps of: (i) exposing the patterned substrate to hydrogen by flowing a hydrogen-containing precursor into the substrate processing region, (ii) removing process effluents including unadsorbed hydrogen-containing precursor from the substrate processing region, (iii) exposing the patterned substrate to fluorine by flowing a fluorine-containing precursor into the substrate processing region to form solid by-products on the patterned substrate, and (iv) removing process effluents including unreacted fluorine-containing precursor from the substrate processing region. The methods further include a sublimation operation of raising a temperature of the substrate above a sublimation temperature to remove the solid by-products. The sublimation operation occurs after the step of exposing the patterned substrate to fluorine. The at least four sequential steps in combination with the sublimation operation are referred to collectively as an etch cycle.

Embodiments of the invention include methods of etching silicon oxide from the walls of a trench on a surface of a patterned substrate in a substrate processing region of a substrate processing chamber. The method includes at least four sequential steps of: (i) exposing the patterned substrate to fluorine by flowing a fluorine-containing precursor into the substrate processing region, (ii) removing process effluents including unadsorbed fluorine-containing precursor from the substrate processing region, (iii) exposing the patterned substrate to hydrogen by flowing a hydrogen-containing precursor into the substrate processing region to form solid by-products on the patterned substrate, and (iv) removing process effluents including unreacted hydrogen-containing precursor from the substrate processing region. The methods further include a sublimation operation of raising a temperature of the substrate above a sublimation temperature to remove the solid by-products. The sublimation operation occurs after the step of exposing the patterned substrate to hydrogen. The at least four sequential steps in combination with the sublimation operation are referred to collectively as an etch cycle.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon oxide from a trench is described which allows more homogeneous etch rates up and down the sides of the trench. One disclosed method includes a sequential introduction of (1) a hydrogen-containing precursor and then (2) a fluorine-containing precursor into a substrate processing region. The temperature of the substrate is low during each of the two steps in order to allow the reaction to proceed and form solid residue by-product. A second disclosed method reverses the order of steps (1) and (2) but still forms solid residue by-product. The solid residue by-product is removed by raising the temperature in a subsequent sublimation step regardless of the order of the two steps.

Siconi™ etch processes are an example of a dry etch process and have used a hydrogen source such as ammonia ($NH_3$) in combination with a fluorine source such as nitrogen trifluoride ($NF_3$). The combination flows into a remote plasma system (RPS) and the plasma effluents created therein are flowed into a substrate processing region. The effluents react with exposed silicon oxide to form solid residue which is then sublimated from the surface to complete the etch process. A thickness variation may be observed along a heterogeneously deposited silicon oxide surface treated with any prior art dry etch including the aforementioned Siconi™ etch. The thickness variation may manifest itself as a "height" difference along the heterogeneously deposited silicon surface. For example, a multi-layer silicon oxide stack having BPSG silicon oxide, PECVD deposited oxide and HDP-CVD deposited oxide may be patterned to form heterogeneously deposited walls on the side of a trench. The BPSG material may etch quite rapidly whereas the PECVD silicon oxide would etch more slowly, and the HDP-CVD silicon oxide would etch slowest of all. A dry etch may be used to widen the trench in preparation for filling the trench with metal to form a contact. A prior art dry etch may form an A-shaped or V-shaped trench profile which would compromise the conductivity or electrical separation of contacts made in this manner.

Performing a Siconi™ etch using sequential steps, as described herein, has been found by the inventors to remove material at a consistent rate across a wide variety of silicon oxide layers. When multiple deposition methods are used on layers used to form the same trench, the walls may be referred to as heterogeneous silicon oxide or heterogeneously-deposited silicon oxide herein. The process sequences described herein produce solid by-products like prior art concurrent Siconi™ processes but ensure that just a couple of monolayers are removed during each etch cycle.

Figure 1:
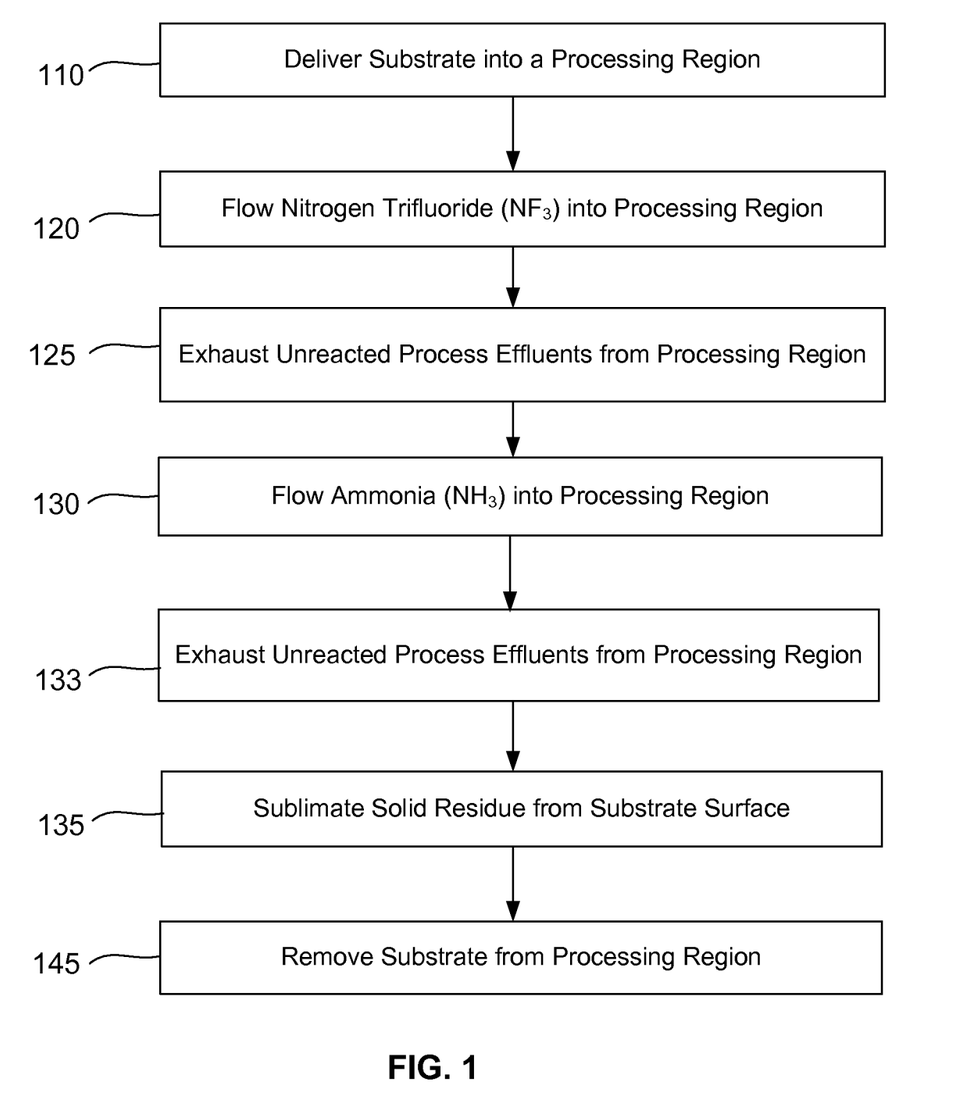
FIG. 1 are a flowchart of a sequential dry etch process according to disclosed embodiments.

In order to better understand and appreciate the invention, reference is now made to FIG. 1 which is a flow chart of a sequential dry etch process, according to disclosed embodiments, applied to a patterned substrate having heterogeneously deposited silicon oxide sidewalls. The process begins when a patterned substrate having a trench with heterogeneous silicon oxide walls is transferred into a substrate processing region (operation 110). A flow of nitrogen trifluoride is directed into the substrate processing region (operation 120). Alternatively, the nitrogen trifluoride is flowed through a remote plasma region and excited in a plasma before it is flowed into the substrate processing region. The remote plasma region may be a distinct module from the substrate processing chamber or a compartment within the processing chamber separated from the substrate processing region by a showerhead. Regardless of whether the nitrogen trifluoride is excited in the remote plasma region or flowed directly into the substrate processing region, the flow of the fluorine-containing precursor and associated plasma effluents coat the silicon oxide with a fluorine-containing adsorbate layer or adlayer. Process effluents, including any unreacted fluorine-containing precursors, are then removed from the substrate processing region (operation 125).

Next, a flow of ammonia is directed into the substrate processing region (operation 130). Again, the ammonia may be flowed through a remote plasma region and excited in a plasma before it is flowed into the substrate processing region. The ammonia (and/or plasma effluents) react with the heterogeneous silicon oxide walls of the trench as well as its fluorine-containing adlayer still resident on the heterogeneous silicon oxide walls to form solid residue by-products. Process effluents, including any unreacted hydrogen-containing precursors (such as ammonia), are removed from the substrate processing region (operation 133). Operations 120-133 occur sequentially, which limits the copresence of hydrogen and fluorine in the substrate processing region and thereby limits the variation in etch rate between dense silicon oxide (e.g. HDP-CVD) and more porous or doped silicon oxide (e.g. BPSG). The temperature of the patterned substrate is maintained at a relatively low level in order to ensure the first fluorine-containing adlayer remains on the surface for the ammonia to react with. The temperature of the patterned substrate throughout the sequence of operations 120-133 may be below one of 90° C., 80° C., 70° C., 60° C., 50° C., 40° C. or 35° C., in disclosed embodiments. Operations 120-135 may be repeated an integral number of times to remove a selectable amount of material (i.e. removing a target thickness).

The substrate is heated to sublimate the solid by-products (operation 135). The temperature of the solid residue and the silicon oxide may be raised above one of 90° C., 100° C., 120° C. or 140° C. during the sublimation, in disclosed embodiments. The duration of the sublimation may be above one of 45 seconds, 60 seconds, 75 seconds, 90 seconds or 120 seconds, in disclosed embodiments. The width of the trenches may be less than one of 35 nm, 30 nm, 25 nm, 20 nm or 15 nm, in embodiments of the invention. Following sublimation, the patterned substrate is removed from the substrate processing region (operation 145).

Figure 2:
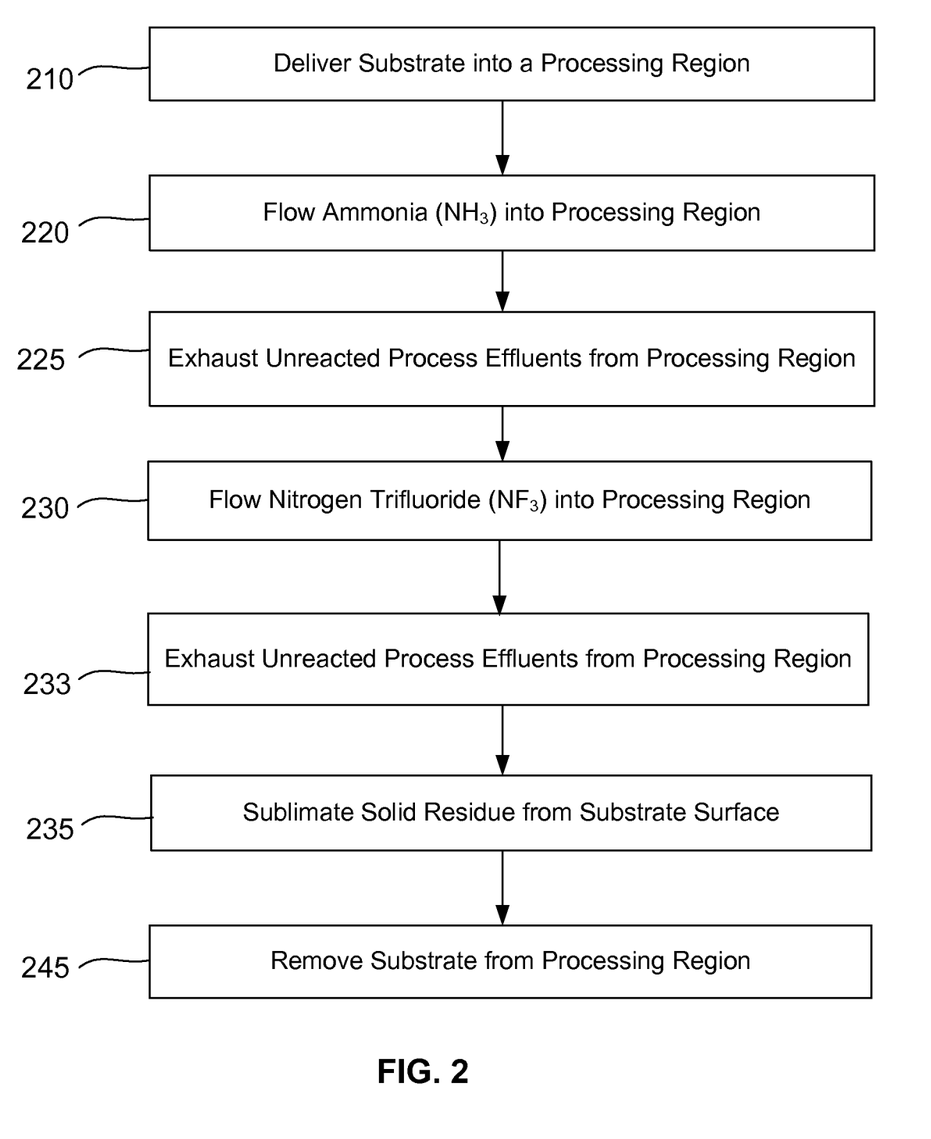
FIG. 2 is a flow chart of another dry etch process according to disclosed embodiments.

Reference is now made to FIG. 2 which is a flow chart of a second exemplary sequential dry etch process, according to disclosed embodiments, applied to a patterned substrate having heterogeneously deposited silicon oxide sidewalls. The process begins when a patterned substrate having a trench with heterogeneous silicon oxide walls is transferred into a substrate processing region (operation 210). A flow of ammonia is directed into the substrate processing region (operation 220). Alternatively, the ammonia is flowed through a remote plasma region and excited in a plasma before it is flowed into the substrate processing region. The remote plasma region may again be a distinct module from the substrate processing chamber or a compartment within the processing chamber separated from the substrate processing region by a showerhead. Regardless of whether the ammonia is excited in the remote plasma region or flowed directly into the substrate processing region, the flow of the hydrogen-containing precursor and associated plasma effluents coat the silicon oxide with a hydrogen-containing adsorbate layer or adlayer. Process effluents, including any unreacted hydrogen-containing precursors, are then removed from the substrate processing region (operation 225).

Next, a flow of nitrogen trifluoride is directed into the substrate processing region (operation 230). Again, the nitrogen trifluoride may be flowed through a remote plasma region and excited in a plasma before it is flowed into the substrate processing region. The nitrogen trifluoride (and/or plasma effluents) react with the heterogeneous silicon oxide walls of the trench as well as its hydrogen-containing adlayer still resident on the heterogeneous silicon oxide walls to form solid residue by-products. Process effluents, including any unreacted fluorine-containing precursors (such as nitrogen trifluoride), are removed from the substrate processing region (operation 233). Operations 220-233 occur sequentially, which limits the copresence of hydrogen and fluorine in the substrate processing region and thereby limits the variation in etch rate between dense silicon oxide (e.g. HDP-CVD) and more porous or doped silicon oxide (e.g. BPSG). The temperature of the patterned substrate is maintained at a relatively low level in order to ensure the first fluorine-containing adlayer remains on the surface for the ammonia to react with. The temperature of the patterned substrate throughout the sequence of operations 220-233 may be below one of 90° C., 80° C., 70° C., 60° C., 50° C., 40° C. or 35° C., in disclosed embodiments. Operations 220-235 may be repeated an integral number of times to remove a selectable amount of material (i.e. removing a target thickness).

The substrate is heated to sublimate the solid by-products (operation 235). The temperature of the solid residue and the silicon oxide may be raised above one of 90° C., 100° C., 120° C. or 140° C. during the sublimation, in disclosed embodiments. The duration of the sublimation may be above one of 45 seconds, 60 seconds, 75 seconds, 90 seconds or 120 seconds, in disclosed embodiments. The width of the trenches may be less than one of 35 nm, 30 nm, 25 nm, 20 nm or 15 nm, in embodiments of the invention. Following sublimation, the patterned substrate is removed from the substrate processing region (operation 245).

A variety of precursors may be flowed into the substrate processing region or the remote plasma region to create plasma effluents as described herein. Generally speaking, a fluorine-containing precursor may be used to augment or replace the nitrogen-trifluoride used in the examples discussed above. The fluorine-containing precursor may include one or more of nitrogen trifluoride, hydrogen fluoride, diatomic fluorine, monatomic fluorine and fluorine-substituted hydrocarbons. Similarly, a hydrogen-containing precursor may be used to augment or replace the ammonia used in the examples discussed previously. The hydrogen-containing precursor may include one or more of atomic hydrogen, molecular hydrogen and ammonia. The hydrogen-containing precursor may be fluorine-free and the fluorine-containing precursor may be hydrogen-free. The inventors have also found that the hydrogen-containing precursor may be HF.

A cycle of etching (e.g. operations 120-135 or operations 220-235) removes more than 4 Å, less than 11 Å or between about 5 Å and about 10 Å of silicon oxide on the substrate in disclosed embodiments. A desirable aspect of the process described and claimed herein is that the claimed etch removes a very similar amount of material regardless of how the silicon oxide was deposited. These processes may prove especially useful when the walls of a trench are deposited by different methods (i.e. the walls are formed of heterogeneous silicon oxide). Etch cycles claimed herein remove between 4 Å and 11 Å of the silicon oxide despite the differing deposition methods. Additional sequential dry etch process parameters are disclosed in the course of describing an exemplary processing system.

Exemplary Processing System

Figure 3:
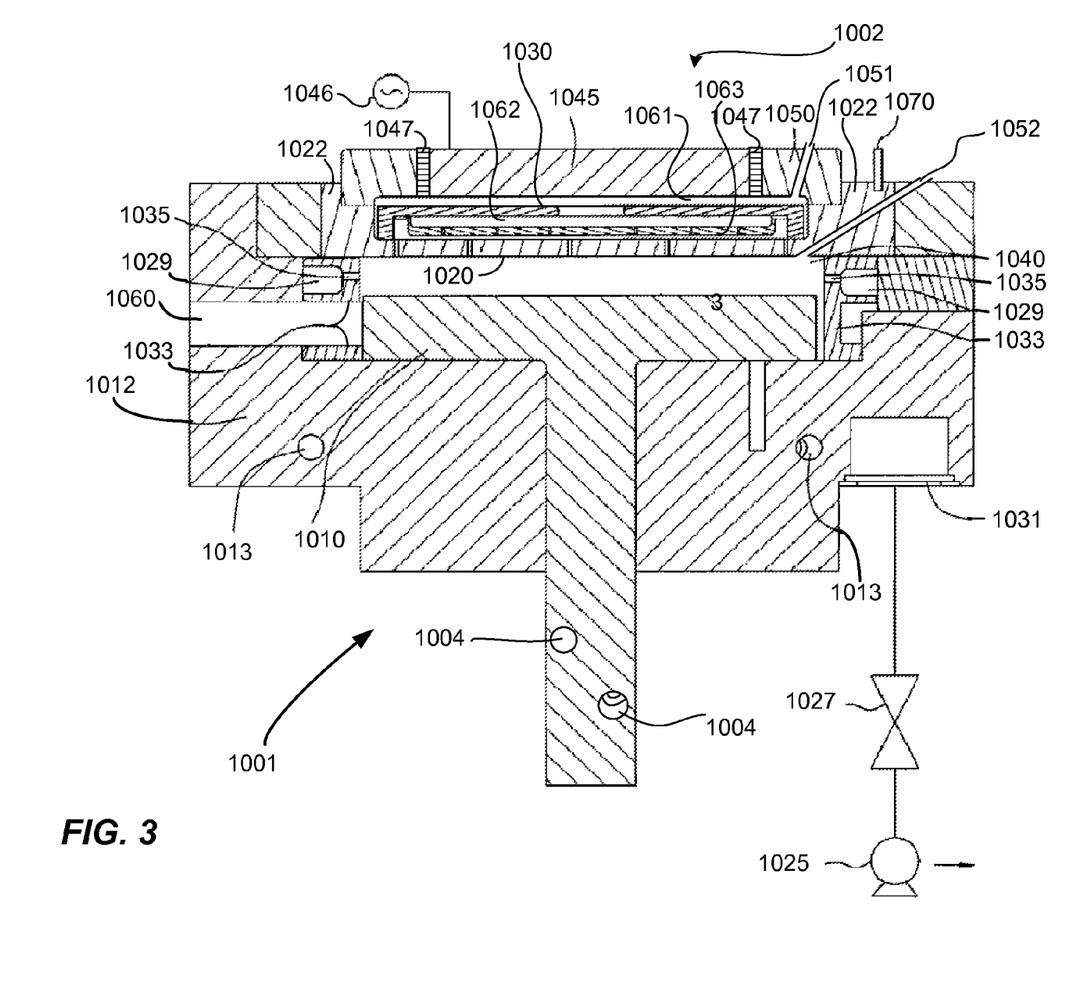
FIG. 3 is a cross-sectional view of a processing chamber for performing etch processes according to disclosed embodiments.

FIG. 3 is a partial cross sectional view showing an illustrative processing chamber 1001, in which, embodiments of the invention may be carried out. Generally, a hydrogen-containing precursor and a fluorine-containing precursor may be introduced through one or more apertures 1051 into remote plasma region(s) 1061-1063. In the processes described and claimed herein, the precursors are sequentially introduced rather than being flowed into the substrate processing region 1040 at the same time. The precursors may or may not be excited by plasma power source 1046.

In one embodiment, the processing chamber 1001 includes a chamber body 1012, a lid assembly 1002, and a support assembly 1010. The lid assembly 1002 is disposed at an upper end of the chamber body 1012, and the support assembly 1010 is at least partially disposed within the chamber body 1012. The processing chamber 1001 and the associated hardware are preferably formed from one or more process-compatible materials (e.g. aluminum, stainless steel, etc.).

The chamber body 1012 includes a slit valve opening 1060 formed in a sidewall thereof to provide access to the interior of the processing chamber 1001. The slit valve opening 1060 is selectively opened and closed to allow access to the interior of the chamber body 1012 by a wafer handling robot (not shown). In one embodiment, a wafer can be transported in and out of the processing chamber 1001 through the slit valve opening 1060 to an adjacent transfer chamber and/or loadlock chamber, or another chamber within a cluster tool. An exemplary cluster tool which may include processing chamber 1001 is shown in FIG. 3.

In one or more embodiments, chamber body 1012 includes a chamber body channel 1013 for flowing a heat transfer fluid through chamber body 1012. The heat transfer fluid can be a heating fluid or a coolant and is used to control the temperature of chamber body 1012 during processing and substrate transfer. Heating the chamber body 1012 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 1010 may have a support assembly channel 1004 for flowing a heat transfer fluid through support assembly 1010 thereby affecting the substrate temperature.

The chamber body 1012 can further include a liner 1033 that surrounds the support assembly 1010. The liner 1033 is preferably removable for servicing and cleaning. The liner 1033 can be made of a metal such as aluminum, or a ceramic material. However, the liner 1033 can be any process compatible material. The liner 1033 can be bead blasted to increase the adhesion of any material deposited thereon, thereby preventing flaking of material which results in contamination of the processing chamber 1001. In one or more embodiments, the liner 1033 includes one or more apertures 1035 and a pumping channel 1029 formed therein that is in fluid communication with a vacuum system. The apertures 1035 provide a flow path for gases into the pumping channel 1029, which provides an egress for the gases within the processing chamber 1001.

The vacuum system can include a vacuum pump 1025 and a throttle valve 1027 to regulate flow of gases through the processing chamber 1001. The vacuum pump 1025 is coupled to a vacuum port 1031 disposed on the chamber body 1012 and therefore, in fluid communication with the pumping channel 1029 formed within the liner 1033. The terms "gas"

and "gases" are used interchangeably, unless otherwise noted, and refer to one or more reactants, catalysts, carrier, purge, cleaning, combinations thereof, as well as any other fluid introduced into the chamber body 1012. The term "precursor" is used to refer to any process gas which takes part in a reaction to either remove or deposit material from a surface.

Apertures 1035 allow the pumping channel 1029 to be in fluid communication with a substrate processing region 1040 within the chamber body 1012. The substrate processing region 1040 is defined by a lower surface of the lid assembly 1002 and an upper surface of the support assembly 1010, and is surrounded by the liner 1033. The apertures 1035 may be uniformly sized and evenly spaced about the liner 1033. However, any number, position, size or shape of apertures may be used, and each of those design parameters can vary depending on the desired flow pattern of gas across the substrate receiving surface as is discussed in more detail below. In addition, the size, number and position of the apertures 1035 are configured to achieve uniform flow of gases exiting the processing chamber 1001. Further, the aperture size and location may be configured to provide rapid or high capacity pumping to facilitate a rapid exhaust of gas from the chamber 1001. For example, the number and size of apertures 1035 in close proximity to the vacuum port 1031 may be smaller than the size of apertures 1035 positioned farther away from the vacuum port 1031.

A gas supply panel (not shown) is typically used to provide process gas(es) to the processing chamber 1001 through one or more apertures 1051. The particular gas or gases that are used depend upon the process or processes to be performed within the chamber 1001. Illustrative gases can include, but are not limited to one or more precursors, reductants, catalysts, carriers, purge, cleaning, or any mixture or combination thereof. Typically, the one or more gases introduced to the processing chamber 1001 flow into plasma volume 1061 through aperture(s) 1051 in top plate 1050. Alternatively or in combination, processing gases may be introduced more directly through aperture(s) 1052 into substrate processing region 1040. Aperture(s) 1052 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 1001. Depending on the process, any number of gases can be delivered to the processing chamber 1001, and can be mixed either in the processing chamber 1001 or before the gases are delivered to the processing chamber 1001.

The lid assembly 1002 can further include an electrode 1045 to generate a plasma of reactive species within the lid assembly 1002. In one embodiment, the electrode 1045 is supported by top plate 1050 and is electrically isolated therefrom by inserting electrically isolating ring(s) 1047 made from aluminum oxide or any other insulating and process compatible material. In one or more embodiments, the electrode 1045 is coupled to a power source 1046 while the rest of lid assembly 1002 is connected to ground. Accordingly, a plasma of one or more process gases can be generated in remote plasma region composed of volumes 1061, 1062 and/or 1063 between electrode 1045 and annular mounting flange 1022. In embodiments, annular mounting flange comprises or supports gas delivery plate 1020. For example, the plasma may be initiated and maintained between electrode 1045 and one or both blocker plates of blocker assembly 1030. Alternatively, the plasma can be struck and contained between the electrode 1045 and gas delivery plate 1020, in the absence of blocker assembly 1030. In either embodiment, the plasma is well confined or contained within the lid assembly 1002. Accordingly, the plasma is a "remote plasma" since no active plasma is in direct contact with the substrate disposed within the chamber body 1012. As a result, plasma damage to the substrate may be avoided since the plasma is separated from the substrate surface.

A wide variety of power sources 1046 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. Microwave frequencies are simply a subset of radio frequencies. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 1001. Exemplary remote plasma generators are available from vendors such as MKS Instruments, Inc. and Advanced Energy Industries, Inc. In the exemplary processing system an RF power supply is coupled to electrode 1045. A higher-power microwave power source 1046 is beneficial in the event that reactive oxygen will also be produced using power source 1046.

The temperatures of the process chamber body 1012 and the substrate may each be controlled by flowing a heat transfer medium through chamber body channel 1013 and support assembly channel 1004, respectively. Support assembly channel 1004 may be formed within support assembly 1010 to facilitate the transfer of thermal energy. Chamber body 1012 and support assembly 1010 may be cooled or heated independently. For example, a heating fluid may be flown through one while a cooling fluid is flown through the other.

Other methods may be used to control the substrate temperature. The substrate may be heated by heating the support assembly 1010 (or a portion thereof, such as a pedestal) with a resistive heater or by some other means. In another configuration, gas delivery plate 1020 may be maintained at a temperature higher than the substrate and the substrate can be elevated in order to raise the substrate temperature. In this case the substrate is heated radiatively or by using a gas to conduct heat from gas delivery plate 1020 to the substrate. The substrate may be elevated by raising support assembly 1010 or by employing lift pins.

During the etch processes described herein, chamber body 1012 may be maintained within an approximate temperature range of between 50° C. and 80° C., between 55° C. and 75° C. or between 60° C. and 70° C. in disclosed embodiments. During exposure to precursors (including for example plasma effluents and oxidizing agents), the substrate may be maintained below the temperatures given previously, between about 15° C. and about 50° C., between about 22° C. and about 40° C., or near 30° C. in disclosed embodiments.

Plasma effluents include a variety of molecules, molecular fragments and ionized species. In the sequential processes described and claimed herein, the remote plasma may not be turned on during the process. Currently entertained theoretical mechanisms of prior art Siconi™ etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from substrate processing region 1040 by vacuum pump 1025. A thin continuous or discontinuous layer of $(NH_4)_2SiF_6$ solid by-products is left behind on the substrate surface. A similar reaction is thought to be occurring for the sequential processes described and claimed herein, however, the intermediate(s) are created and used close to or on the surface of the substrate.

Following exposure to plasma effluents and the associated accumulation of solid by-products, the substrate may be heated to remove the by-products. In embodiments, the gas delivery plate 1020 is heatable by incorporating heating element 1070 within or near gas delivery plate 1020. The substrate may be heated by reducing the distance between the substrate and the heated gas delivery plate. The gas delivery plate 1020 may be heated to between about 100° C. and 150° C., between about 110° C. and 140° C. or between about 120° C. and 130° C. in disclosed embodiments. By reducing the separation between the substrate and the heated gas delivery plate, the substrate may be heated to above about 75° C., above about 90° C., above about 100° C. or between about 115° C. and about 150° C. in disclosed embodiments. The heat radiated from gas delivery plate 1020 to the substrate should be made sufficient to dissociate or sublimate solid $(NH_4)_2SiF_6$ on the substrate into volatile $SiF_4$, $NH_3$ and HF products which may be pumped away from substrate processing region 1040. Other methods of imparting heat to the substrate may also be used.

Nitrogen trifluoride (or another fluorine-containing precursor) may be flowed into remote plasma volume 1061 (or directly into substrate processing region 1040 when no remote plasma is used) at rates between about 25 sccm and about 200 sccm, between about 50 sccm and about 150 sccm or between about 75 sccm and about 125 sccm in disclosed embodiments. Ammonia (or hydrogen-containing precursors in general) may be flowed into remote plasma volume 1061 (or directly into substrate processing region 1040 as above) at rates between about 50 sccm and about 300 sccm, between about 75 sccm and about 250 sccm, between about 100 sccm and about 200 sccm or between about 120 sccm and about 170 sccm in disclosed embodiments.

Combined flow rates of hydrogen-containing and fluorine-containing precursors into the remote plasma region may account for 0.05% to about 20% by volume of the overall gas mixture; the remainder being a carrier gas. In one embodiment, a purge or carrier gas is first initiated into the remote plasma region before those of the reactive gases to stabilize the pressure within the remote plasma region.

Production of plasma effluents (when used) occurs within volumes 1061, 1062 and/or 1063 by applying plasma power to electrode 1045 relative to the rest of lid assembly 1002. Plasma power can be a variety of frequencies or a combination of multiple frequencies. In the exemplary processing system the plasma is provided by RF power delivered to electrode 1045. The RF power may be between about 1 watt and about 1000 watts, between about 5 watts and about 600 watts, between about 10 watts and about 300 watts or between about 20 watts and about 100 watts in disclosed embodiments. The RF frequency applied in the exemplary processing system may be less than about 200 kHz, less than about 150 kHz, less than about 120 kHz or between about 50 kHz and about 90 kHz in embodiments of the invention.

Substrate processing region 1040 can be maintained at a variety of pressures during the flow of ozone, oxygen, carrier gases and/or plasma effluents into substrate processing region 1040. The pressure may be maintained between about 500 mTorr and about 30 Ton, between about 1 Ton and about 10 Ton or between about 3 Ton and about 6 Ton in disclosed embodiments. Lower pressures may also be used within substrate processing region 1040. The pressure may be maintained below or about 500 mTorr, below or about 250 mTorr, below or about 100 mTorr, below or about 50 mTorr or below or about 20 mTorr in disclosed embodiments. The processing pressures are less important for the alternating exposure process described and claimed herein compared to a process where the fluorine-containing precursor and the hydrogen-containing precursor are both present at the same time in the substrate processing region (a.k.a. being copresent).

In one or more embodiments, the processing chamber 1001 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Etching chambers that may implement embodiments of the present invention may include dielectric etch chambers, high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers.

Figure 4:
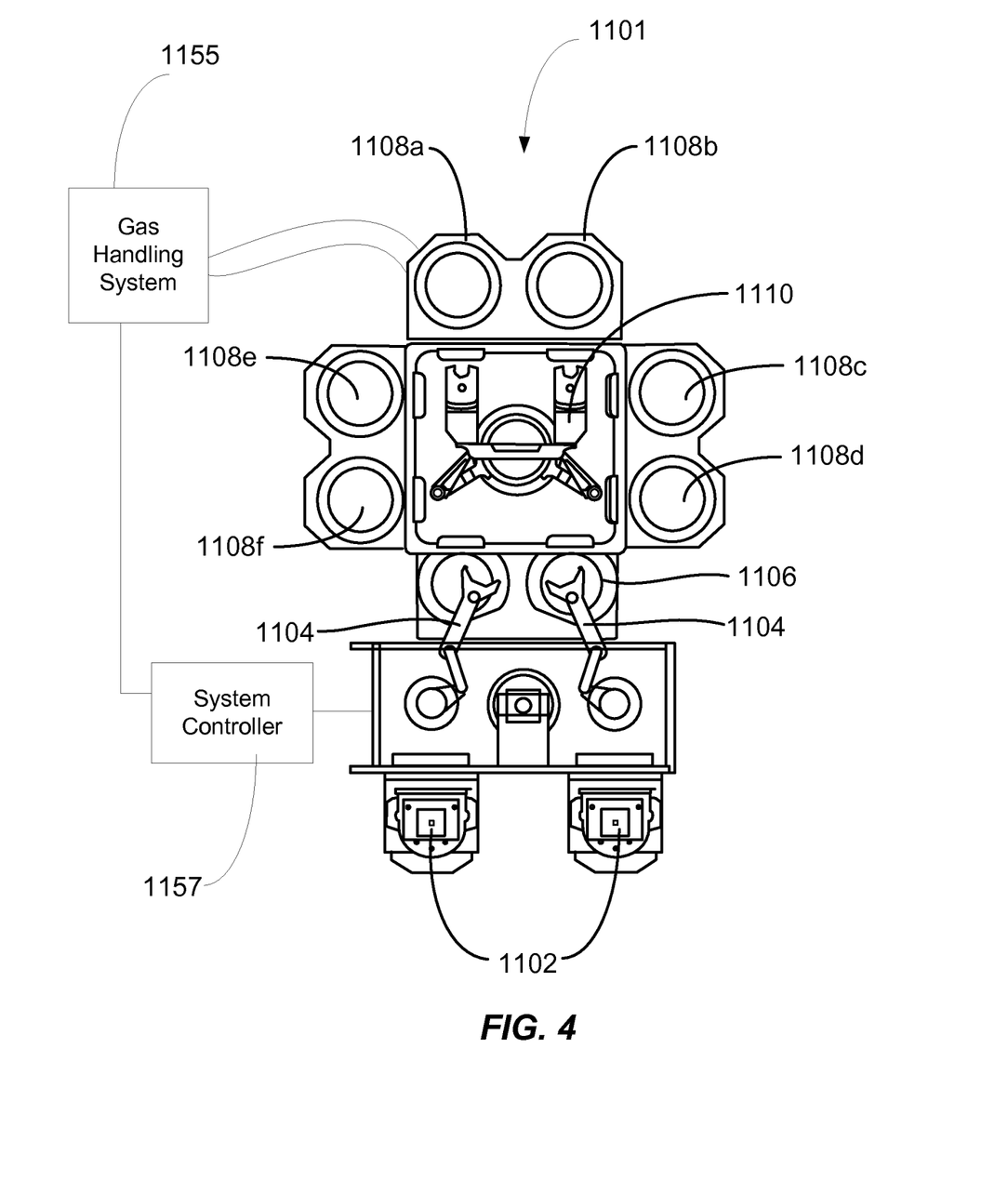
FIG. 4 is a processing system for performing etch processes according to disclosed embodiments.

Embodiments of the etching systems may be incorporated into larger fabrication systems for producing integrated circuit chips. FIG. 4 shows one such system 1101 of etching and deposition chambers according to disclosed embodiments. In the figure, a pair of FOUPs (front opening unified pods) 1102 supply substrate substrates (e.g., 300 mm diameter wafers) that are received by robotic arms 1104 and placed into a low pressure holding area 1106 before being placed into one of the wafer processing chambers 1108*a-f*. A second robotic arm 1110 may be used to transport the substrate wafers from the holding area 1106 to the processing chambers 1108*a-f* and back. Each processing chamber 1108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The processing chambers 1108*a-f* may include one or more system components for depositing, annealing, curing and/or etching a flowable dielectric film on the substrate wafer. In one configuration, two pairs of the processing chamber (e.g., 1108*c-d* and 1108*e-f*) may be used to deposit dielectric material on the substrate, and the third pair of processing chambers (e.g., 1108*a-b*) may be used to etch the deposited dielectric. In another configuration, all three pairs of chambers (e.g., 1108*a-f*) may be configured to etch a dielectric film on the substrate. Any one or more of the processes described may be carried out on chamber(s) separated from the fabrication system shown in disclosed embodiments.

System controller 1157 is used to control motors, valves, flow controllers, power supplies and other functions required to carry out process recipes described herein. A gas handling system 1155 may also be controlled by system controller 1157 to introduce gases to one or all of the processing chambers 1108*a-f*. System controller 1157 may rely on feedback from optical sensors to determine and adjust the position of movable mechanical assemblies in gas handling system 1155 and/or in processing chambers 1108*a-f*. Mechanical assemblies may include the robot, throttle valves and susceptors which are moved by motors under the control of system controller 1157.

In an exemplary embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains processing chamber 1001 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" may include minority concentrations of other elemental constituents such as nitrogen, hydrogen, carbon and the like. A gas may be a combination of two or more gases. The term "trench" is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching silicon oxide from the walls of a trench on a surface of a patterned substrate in a substrate processing chamber, the chamber having a substrate processing region and a plasma generating region remote from the substrate processing region, the method comprising:
    exposing the patterned substrate to hydrogen by flowing a hydrogen-containing precursor into the substrate processing region,
    removing process effluents including unadsorbed hydrogen-containing precursor from the substrate processing region,
    exposing the patterned substrate to hydrogen-free fluorine by flowing a fluorine-containing precursor into the substrate processing region to form solid by-products on the patterned substrate, and
    removing process effluents including unreacted fluorine-containing precursor from the substrate processing region; and
    raising a temperature of the substrate above a sublimation temperature to remove the solid by-products, wherein the sublimation operation occurs after the step of exposing the patterned substrate to fluorine, and wherein the at least four sequential steps in combination with the sublimation operation are referred to collectively as an etch cycle.

2. The method of claim 1 wherein the operations are repeated until a target thickness of the silicon oxide layer is removed.

3. The method of claim 1 wherein the hydrogen-containing precursor is fluorine-free.

4. The method of claim 1 wherein a temperature of the patterned substrate is below 90° C. during the steps of exposing the patterned substrate to hydrogen and exposing the patterned substrate to fluorine.

5. The method of claim 1 wherein the sublimation temperature is greater than 90° C.

6. The method of claim 1 wherein the silicon oxide which forms a wall of the trench is heterogeneous in terms of deposition method but the etch cycle removes between 4 Å and 11 Å of the silicon oxide despite the differing deposition methods.

7. The method of claim 1 wherein the hydrogen-containing precursor is passed through a remote plasma before entering the substrate processing region.

8. The method of claim 1 wherein the fluorine-containing precursor is passed through a remote plasma before entering the substrate processing region.

9. The method of claim 1 wherein the hydrogen-containing precursor comprises at least one precursor selected from the group consisting of atomic hydrogen, molecular hydrogen and ammonia.

10. The method of claim 1 wherein the fluorine-containing precursor comprises at least one precursor selected from the group consisting of nitrogen trifluoride, hydrogen fluoride, diatomic fluorine, monatomic fluorine.

11. A method of etching silicon oxide from the walls of a trench on a surface of a patterned substrate in a substrate processing chamber, the chamber having a substrate processing region and a plasma generating region remote from the substrate processing region, the method comprising
   (i) exposing the patterned substrate to hydrogen-free fluorine by flowing a fluorine-containing precursor into the substrate processing region,
   (ii) removing process effluents including unadsorbed fluorine-containing precursor from the substrate processing region,
   (iii) exposing the patterned substrate to hydrogen by flowing a hydrogen-containing precursor into the substrate processing region to form solid by-products on the patterned substrate, and
   (iv) removing process effluents including unreacted hydrogen-containing precursor from the substrate processing region; and
   raising a temperature of the substrate above a sublimation temperature to remove the solid by-products, wherein the sublimation operation occurs after the step of exposing the patterned substrate to hydrogen, and wherein the at least four sequential steps in combination with the sublimation operation are referred to collectively as an etch cycle.

12. The method of claim 11 wherein the operations are performed sequentially.

13. The method of claim 11 wherein the operations are repeated until a target thickness of the silicon oxide layer is removed.

14. The method of claim 11 wherein the hydrogen-containing precursor is fluorine-free.

15. The method of claim 11 wherein a temperature of the patterned substrate is below 90° C. during the steps of exposing the patterned substrate to hydrogen and exposing the patterned substrate to fluorine.

16. The method of claim 11 wherein the sublimation temperature is greater than 90° C.

17. The method of claim 11 wherein the silicon oxide which forms a wall of the trench is heterogeneous in terms of deposition method but the etch cycle removes between 4 Å and 11 Å of the silicon oxide despite the differing deposition methods.

\* \* \* \* \*